United States Patent
Sekiguchi et al.

(10) Patent No.: US 11,906,420 B2
(45) Date of Patent: Feb. 20, 2024

(54) LIGHT SOURCE AND BIOCHEMICAL ANALYZER

(71) Applicant: Hitachi High-Tech Corporation, Tokyo (JP)

(72) Inventors: Yoshifumi Sekiguchi, Tokyo (JP); Shin Imamura, Tokyo (JP); Takahiro Ando, Tokyo (JP); Tomoto Kawamura, Tokyo (JP); Yuya Matsuoka, Tokyo (JP); Sakuichiro Adachi, Tokyo (JP); Yasuhiro Keta, Tokyo (JP); Eiichiro Takada, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 310 days.

(21) Appl. No.: 17/594,895

(22) PCT Filed: Jan. 31, 2020

(86) PCT No.: PCT/JP2020/003587
§ 371 (c)(1),
(2) Date: Nov. 2, 2021

(87) PCT Pub. No.: WO2020/240926
PCT Pub. Date: Dec. 3, 2020

(65) Prior Publication Data
US 2022/0214266 A1      Jul. 7, 2022

(30) Foreign Application Priority Data

May 27, 2019 (JP) .................. 2019-098266

(51) Int. Cl.
*G01N 21/01* (2006.01)
*G01N 21/59* (2006.01)
*G01N 21/63* (2006.01)

(52) U.S. Cl.
CPC ............. *G01N 21/01* (2013.01); *G01N 21/59* (2013.01); *G01N 21/63* (2013.01); *G01N 2021/0106* (2013.01); *G01N 2201/061* (2013.01)

(58) Field of Classification Search
CPC ........ G01N 21/01; G01N 21/59; G01N 21/63; G01N 2021/0106; G01N 2201/061
See application file for complete search history.

(56) References Cited

U.S. PATENT DOCUMENTS

| 6,992,718 | B1 | 1/2006 | Takahara |
| 8,785,885 | B1* | 7/2014 | Jutamulia .......... G01N 21/6458 250/458.1 |

(Continued)

FOREIGN PATENT DOCUMENTS

| JP | 2000-194067 A | 7/2000 |
| JP | 2001-352101 A | 12/2001 |

(Continued)

OTHER PUBLICATIONS

International Search Report (PCT/ISA/210) issued in PCT Application No. PCT/JP2020/003587 dated Mar. 31, 2020 with English translation (five (5) pages).

(Continued)

*Primary Examiner* — David P Porta
*Assistant Examiner* — Fani Polyzos Boosalis
(74) *Attorney, Agent, or Firm* — Crowell & Moring LLP

(57) ABSTRACT

This invention is capable of improving performance of a biochemical analyzer and facilitating the maintenance. A light source includes: a first LED that emits ultraviolet light and a second LED that has a light emission spectrum different from that of the first LED, the first LED and the second LED being disposed in parallel; a reflection surface that is opposite to the first LED and reflects light of the first (Continued)

LED; and a dichroic surface that is opposite to the second LED, reflects light of the first LED, and allows light of the second LED to penetrate. When an optical member including the dichroic surface is made to be the dichroic prism, the reflection surface reflects light of the first LED to the second LED side, and by using light source of a configuration having a light shielding unit between a light emission surface of the second LED and a dichroic prism, entering of a light emitted from the plural LEDs as a one light beam (beam) to an optical system of latter stage of the biochemical analyzer is enabled.

17 Claims, 12 Drawing Sheets

(56) References Cited

U.S. PATENT DOCUMENTS

| | | | |
|---|---|---|---|
| 9,500,635 B2* | 11/2016 | Islam | G01N 21/359 |
| 2006/0227302 A1 | 10/2006 | Harbers et al. | |
| 2007/0291491 A1 | 12/2007 | Li et al. | |
| 2008/0192457 A1 | 8/2008 | Krijn et al. | |
| 2009/0201577 A1 | 8/2009 | LaPlante et al. | |
| 2013/0215397 A1 | 8/2013 | Matsubara | |
| 2019/0380568 A1* | 12/2019 | Duan | G02B 23/2461 |

FOREIGN PATENT DOCUMENTS

| | | |
|---|---|---|
| JP | 2006-332042 A | 12/2006 |
| JP | 2008-546015 A | 12/2008 |
| JP | 2010-503004 A | 1/2010 |
| JP | 2014-179407 A | 9/2014 |
| WO | WO 2012/063322 A1 | 5/2012 |

OTHER PUBLICATIONS

Japanese-language Written Opinion (PCT/ISA/237) issued in PCT Application No. PCT/JP2020/003587 dated Mar. 31, 2020 (three (3) pages).

* cited by examiner

A1···FIRST APERTURE STOP
A2···IRRADIATION LENS SYSTEM
A3···SECOND APERTURE STOP
A4···SAMPLE CELL
A5···DETECTION LENS SYSTEM
A6···THIRD APERTURE STOP
A7···LIGHT DETECTOR
A8···IMAGINAL PLANE

LIGHT SOURCE AND BIOCHEMICAL ANALYZER

TECHNICAL FIELD

The present disclosure relates to a light source with wide wavelength range, and a biochemical analyzer using the same.

BACKGROUND ART

A biochemical analyzer is configured to irradiate the reagent-added sample with light, and to measure the light emission intensity so that concentration of the biological sample is observed. The biochemical analyzer employs the light source capable of emitting light with wide-ranged wavelength from 340 to 800 nm for irradiating the sample.

Recently, the LED (Light Emitting Diode) that emits near-ultraviolet light has been developed, and employed as the light source for analyzing the sample. The biochemical analyzer analyzes the sample using light in the wide-ranged wavelength from 340 to 800 nm as described above. If such LED is used as the light source, the wavelength range of each of the LEDs from 30 to 100 nm is narrow compared with the wavelength range required by the biochemical analyzer. Accordingly, it is necessary to use the phosphor excited by ultraviolet LED light to emit light to the wavelength region of near-infrared light, or use multiple LEDs.

Patent Literature 1 discloses the phosphor excited by the near-ultraviolet LED to emit the near-infrared light, specifically, $LiAlO_2:Fe$ (peak wavelength of light emission spectrum: 746 nm) and $Al_2O_3:Cr$ (no description on the light emission wavelength) as exemplified phosphors of the light emitting device for emitting infrared light (see Abstract, paragraph 0066, and FIG. 3). Patent Literatures 2 to 4 disclose the light emitting device using multiple LEDs.

CITATION LIST

Patent Literature

Patent Literature 1: Japanese Patent Application Laid-Open No. 2001-352101
Patent Literature 2: Japanese Patent Application Laid-Open No. 2014-179407
Patent Literature 3: Japanese Patent Application Laid-Open No. 2000-194067
Patent Literature 4: Japanese translation of PCT international application No. 2008-546015

Technical Problem

Instead of using the short-life tungsten lamp, LED light sources of multiple types each having different wavelength region may be used as the light source for the biochemical analyzer. The use of the LED light sources of multiple types makes it difficult to make light rays emitted from the multiple LEDs incident on a rear stage optical system of the biochemical analyzer as the single light beam (beam).

In light of the problem as described above, it is an object of the present disclosure to provide a light source using the long-life LED for facilitating the maintenance, and a biochemical analyzer using the light source.

Solution to Problem

In order to attain the above-described object, the present disclosure provides a light source and a biochemical analyzer using the light source. The light source includes a first LED and a second LED having a light emission spectrum different from that of the first LED that are disposed in parallel, one of which emits ultraviolet light, a reflection surface that is opposite to the first LED, and reflects light of the first LED, a dichroic surface that is opposite to the second LED, reflects light of the first LED, and allows light of the second LED to penetrate, and a light shielding unit that is disposed on a side of the first LED or the second LED of the reflection surface and the dichroic surface and shields the ultraviolet light. The light shielding unit is opposite to a light emission surface of the first LED or the second LED.

In order to attain the above-described object, the present disclosure provides a light source and a biochemical analyzer using the light source. The light source includes a first LED and a second LED having a light emission spectrum different from that of the first LED that are disposed in parallel, one of which emits ultraviolet light, a dichroic prism that includes a reflection surface opposite to the first LED to reflect light of the first LED to a side of the second LED, and a dichroic surface opposite to the second LED to reflect light of the first LED, and to allow light of the second LED to penetrate, and a light shielding unit disposed between a light emission surface of the first LED or the second LED and the dichroic prism.

In order to attain the above-described object, the present disclosure provides a light source and a biochemical analyzer using the light source. The light source includes a first LED and a second LED having a light emission spectrum different from that of the first LED that are disposed in parallel that are disposed in parallel, one of which emits ultraviolet light, a reflection surface that is opposite to the first LED and reflects light of the first LED, and a dichroic surface that is opposite to the second LED, reflects light of the first LED, and allows light of the second LED to penetrate. The other of the first LED and the second LED is a white color LED whose main emission light is not ultraviolet light. A filter member is disposed so as to be opposite to a light emission surface of the white color LED. A penetration efficiency with respect to ultraviolet light of the filter member is lower than a penetration efficiency with respect to light having longer wavelength compared to the ultraviolet light.

Advantageous Effects of Invention

In the present disclosure, the light source that can be made long-life using the LED ensures to facilitate the maintenance of the biochemical analyzer. Other problems, structures, and advantageous effects besides those described above will be clarified by explanations of embodiments as follows.

DESCRIPTION OF EMBODIMENT

Figure 1A:
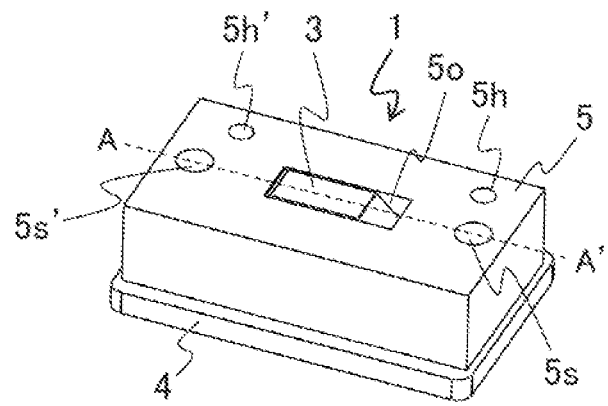
FIGS. 1A to 1E are drawings each showing a configuration of a light source that is used for a biochemical analyzer of the present disclosure.

Embodiments of the present disclosure will be described referring to the drawings. The embodiments of the present disclosure are not limited to those to be described below, and can be variously modified within the technical idea of the disclosure. Each part in the respective drawings, which is used in common for explanations of the respective embodiments will be designated with the same code so that redundant explanations can be omitted.

FIRST EMBODIMENT

A first embodiment relates to the light source configured to include a first LED and a second LED having a light emission spectrum different from that of the first LED that are disposed in parallel, one of which emits ultraviolet light, a reflection surface that is opposite to the first LED, and reflects light of the first LED, a dichroic surface that is opposite to the second LED, reflects light of the first LED, and allows light of the second LED to penetrate, and a light shielding unit that is disposed on a side of the first LED or the second LED of the reflection surface and the dichroic surface and shields the ultraviolet light. The light shielding unit is opposite to a light emission surface of the first LED or the second LED.

FIGS. 1A to 1E are drawings each showing a configuration of a light source of the first embodiment. A light source 1 includes two LED packages 2w, 2u each having a different light emission wavelength, a dichroic prism 3 that combines light beams emitted from the two LED packages into a single beam, an LED substrate 4 that furnishes the LED packages thereon, and a light shielding frame 5 that fixes the dichroic prism 3 to the LED substrate 4. The LED package 2u emits ultraviolet light. A part of the light shielding frame 5 performs the function as a light shielding unit disposed between light emission surfaces of the two LED packages and the dichroic prism for suppressing the ultraviolet light from reaching the LED package 2w.

Figure 1B:
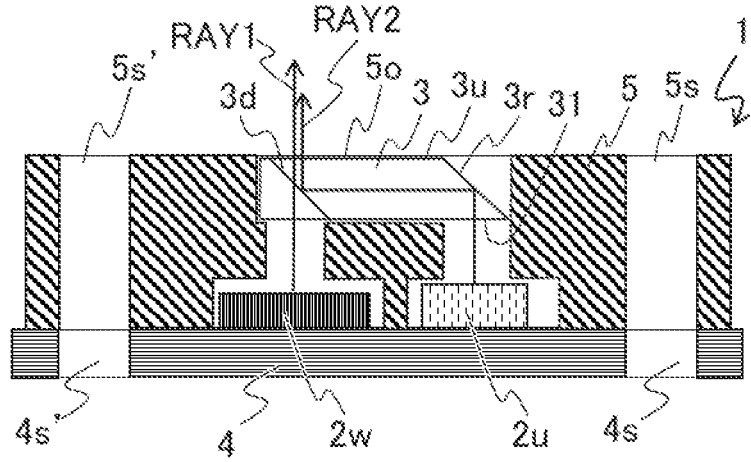
Figure 1C:
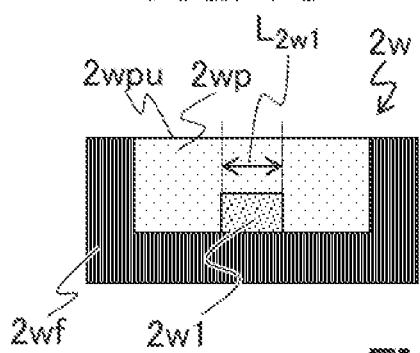
Figure 1D:
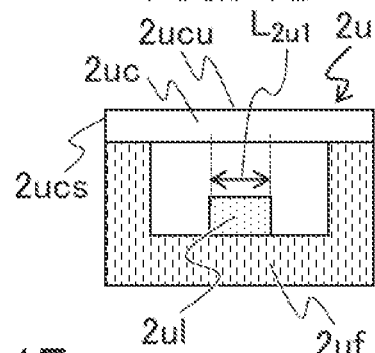
Figure 1E:
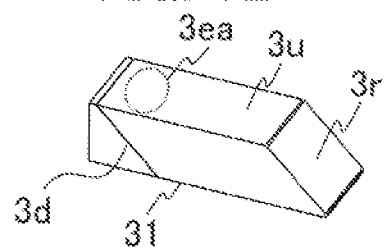

FIG. 1A is a perspective view of the light source 1, FIG. 1B is a sectional view taken along line A-A' of FIG. 1A, FIG. 1C is a detailed view of the LED package 2w, FIG. 1D is a detailed view of the LED package 2u, and FIG. 1E is a perspective view of the dichroic prism 3.

In this embodiment, the LED package 2w emitting light with wavelength ranging from 380 nm to 800 nm will be referred to as a white color LED package in the specification. The LED package 2u that exhibits an emission peak at 340 nm will be referred to as an ultraviolet LED package.

The white color LED package 2w will be described referring to FIG. 1C. An LED 2wl is disposed in a recess part of a white color LED frame 2wf, and sealed with a phosphor-dispersed resin 2wp. The white LED frame 2wf is made of a resin or a ceramic.

The LED 2wl is a light source for exciting the phosphor. In the embodiment, the LED 2wl exhibits the emission peak at 385 nm. The resin 2wp has multiple types of phosphors dispersed to generate continuous light emission spectrum from 385 nm to 800 nm. In the embodiment, the phosphors of multiple types are dispersed in the resin. It is also possible to laminate phosphor films on the LED 2wl. It is still possible to laminate a part of the phosphor, and to disperse another part thereof. The resin can be arbitrarily formed so long as the continuous light emission spectrum with the given wavelength range, that is, from 385 nm to 800 nm can be generated. The continuous spectrum does not have to be in a complete state so long as sufficient light emission intensity can be attained at the wavelength used for the biochemical analyzer. Each light emitted by the phosphor and emitted by the LED 2wl is emitted from an upper surface 2wpu of the resin 2wp. The upper surface 2wpu of the resin 2wp becomes a light emission surface of the white color LED package 2w.

The present disclosure does not limit the structure of the white color LED package 2w. The resin 2wp is allowed to contain not only the phosphor but also microparticles. Dispersion of the contained microparticles is intended to improve dispersibility of the phosphor, and to apply excited light to the phosphor efficiently by light scattering.

The ultraviolet LED package 2u will be described referring to FIG. 1D. An LED 2ul is disposed in a recess part of an ultraviolet LED frame 2uf. An opening of the ultraviolet LED frame 2uf is covered with a sealing glass 2uc. The LED 2ul exhibits the emission peak at 340 nm. As ultraviolet light deteriorates peripheral members, the ultraviolet LED package 2u is made of the material that is hardly deteriorated by ultraviolet light. The sealing glass 2uc is made of the member that does not absorb ultraviolet light, for example, quartz glass. The ultraviolet LED frame 2uf is made of a ceramic, for example, AlN, $Al_2O_3$, sapphire, Al, Cu, and the like.

The present disclosure does not limit the structure of the ultraviolet LED package 2u. Light is emitted from the LED 2ul through the sealing glass 2uc. Accordingly, an upper surface 2ucu and a side surface 2ucs of the sealing glass become the light emission surfaces of the ultraviolet LED package 2u. In the embodiment, the LED 2ul is furnished in the recess part of the LED frame 2uf, and sealed with the sealing glass 2uc. The structure of the ultraviolet LED package 2u is not limited to the one as described above. For example, it is possible to seal the recess part of the LED frame 2uf together with the LED 2ul with the UV resistant resin such as fluororesin, silicone resin, epoxy resin, acrylic resin, and cycloolefin resin for sealing.

The wavelength is specified approximately in the first embodiment. However, the present disclosure does not limit the wavelength as specified.

The light source of the present disclosure becomes essential in the case where the LED 2ul emits ultraviolet light or near-ultraviolet light (for example, light with wavelength ranging from 340 nm to 430 nm), and the LED 2wl emits light with wavelength longer than the light emitted by the LED 2ul.

The dichroic prism 3 will be described referring to FIGS. 1B and 1E. The dichroic prism 3 includes a reflection surface 3r and a dichroic surface 3d. The reflection surface 3r is directed opposite to the ultraviolet LED package 2*u*, and the dichroic surface 3*d* is directed opposite to the white color LED package 2*w*.

In this embodiment, the reflection surface 3*r* is mirror finished for reflecting light utilizing total light reflection, and inclined at an angle of 45° to a bottom surface 31 of the dichroic prism 3. The reflection surface 3*r* may be provided with a metal film such as aluminum formed thereon, or provided with a multi-layer film of dielectric (dielectric multi-layer film) formed thereon in a non-restricted manner so long as it performs the function for reflecting light emitted from the ultraviolet LED package 2*u* to the side of the dichroic surface 3*d*.

In this embodiment, the dichroic surface 3*d* is derived from forming a thin film such as the dielectric multi-layer film on the mirror finished surface. The thin film is interposed between two glass members. The mirror surface refers to the smooth surface having the surface roughness smaller than the wavelength of light incident on the surface. The dichroic surface 3*d* is inclined at 45° to the bottom surface 31, and exhibits high penetration efficiency to the light from the white color LED package 2*w*, and exhibits high reflection factor to the light from the ultraviolet LED package 2*u*. For example, the surface is intended to exhibit the penetration efficiency to the light from the white color LED package 2*w*, which is equal to or higher than 80%, and the reflection factor to the light from the ultraviolet LED package 2*u*, which is equal to or higher than 80%. Preferably, both the penetration efficiency and the reflection factor are equal to or higher than 90%.

In the structure, the light beam Ray2 emitted from the ultraviolet LED package 2*u* is reflected by the reflection surface 3*r*, and further reflected by the dichroic surface 3*d* so that the light beam is emitted from the upper surface 3*u* of the dichroic prism 3 toward the rear stage optical system of the biochemical analyzer. Meanwhile, the light beam Ray1 emitted from the white color LED package 2*w* penetrates through the dichroic surface 3*d*, and is further emitted from the upper surface 3*u* toward the rear stage optical system of the biochemical analyzer.

Generally, only a part of the light emitted from the light source 1 can be effectively utilized by the rear stage optical system of the biochemical analyzer. In the embodiment, among light beams emitted from an effective region 3*ea* as shown in FIG. 1E, the one only at the angle of several degrees or less with respect to the normal direction of the upper surface 3*u* is effectively utilized by the rear stage optical system. The effective region 3*ea* is a part of the upper surface 3*u* opposite to the dichroic surface 3*d*. The position and shape of the effective region 3*ea* is determined in accordance with the rear stage optical system.

The use of the light source structured according to the example allows light beams emitted from the white color LED package 2*w* and the ultraviolet LED package 2*u* to be combined on the dichroic surface 3*d*, and the resultant single light beam (beam) to be emitted from the effective region 3*ea* toward the rear stage optical system. The biochemical analyzer that employs the light source 1 allows a light receiving device to monitor light absorption (penetrated light volume) through the sample cell that contains the specimen.

As peripheries of the white color LED package 2*w* and the ultraviolet LED package 2*u* are heated, it is preferable to provide the cooling structure to the rear of the LED substrate 4. Especially, the phosphor-dispersed in the resin 2*wp* serves to absorb the light with specific wavelength from near-ultraviolet light to blue light. The phosphor that is excited by the light with such wavelength to emit light may lower the light emission efficiency upon increase in the temperature. The LED is also likely to lower the efficiency upon increase in the temperature. It is desirable to provide the light source 1 with the cooling mechanism.

The structure according to the embodiment is required to solve a new problem of deterioration in the peripheral member owing to ultraviolet light. Especially, the resin as one of members for forming the white color LED package 2*w* absorbs ultraviolet light, resulting in aging deterioration. The phosphor-dispersed resin 2*wp* absorbs ultraviolet light, and may turn yellow in color (this phenomenon is referred to as "yellowed" hereinafter).

In this case, the resin 2*wp* absorbs the light with wavelength substantially equal to or less than 370 nm in the white color LED package 2*w*, and then yellowed. If the ultraviolet light is continuously radiated to the white color LED package 2*w*, the yellowing proceeds in accordance with the use period of the light source 1. As the yellowing proceeds, the light with wavelength substantially equal to or less than 500 nm is absorbed by the resin to reduce blue light. Meanwhile, as the LED 2*wl* exhibits the emission peak at 385 nm, in many cases, the light quantity at 385 nm becomes the largest. As the yellowing proceeds, the resin 2*wp* absorbs the light with wavelength of 385 nm, and is heated. The heat accelerates deterioration of the resin 2*wp*, which may cause the risk of deteriorating the phosphor. This phenomenon causes the new problem in the structure having the ultraviolet LED package 2*u* and the white color LED package 2*w* adjacently disposed. Such problem has never occurred in the generally employed structure.

Improvement in the structure of the light shielding frame 5 of the light source according to the embodiment as shown in FIG. 1 reduces quantity of light emitted from the ultraviolet LED package 2*u*, which reaches the white color LED package 2*w*.

Figure 2:
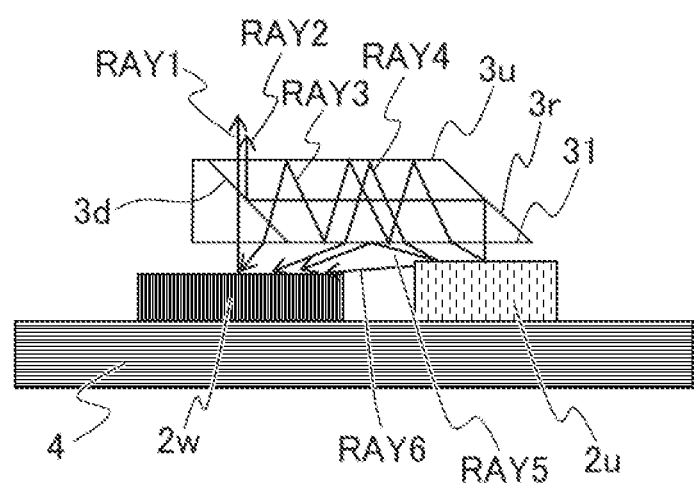
FIG. 2 is a drawing that explains the detail of a new problem in a light source of the first embodiment.

The new problem will be described referring to FIG. 2. FIG. 2 indicates the light beam that reaches the white color LED package 2*w* in the absence of the light shielding frame.

Referring to the drawing, in an exemplary case of a light beam Ray3, the light inclinedly emitted from the ultraviolet LED package 2*u* is reflected by the upper surface 3*u* of the dichroic prism 3, and further reflected by the bottom surface 31 again. The light then penetrates through the dichroic surface 3*d* while repeating reflections as described above, and reaches the white color LED package 2*w* from the bottom surface 31. Although the dichroic prism 3 is transparent, surface reflection of a part of the light occurs on the upper surface 3*u* and the bottom surface 31 based on the Fresnel reflection factor.

Light with the specific wavelength incident on the dichroic surface 3*d* at the specific angle results in the predetermined reflection factor and a predetermined penetration efficiency. In the embodiment, the reflection factor of the light with wavelength of 340 nm at an angle of 45°, which makes incident with respect to the normal line of the dichroic surface 3*d* is set to 90% or higher. The light deviating from the incident angle of 45° like the Ray3 may cause penetration.

That is, the dichroic prism 3 disposed in front of the two LED packages allows the light inclinedly emitted from the ultraviolet LED package 2*u* to reach the white color LED package 2*w* via the Fresnel reflection and penetration through the dichroic surface 3*d*.

In an exemplary case of a light beam Ray4, the light inclinedly emitted from the ultraviolet LED package 2*u* is Fresnel reflected by the upper surface 3*u* of the dichroic prism 3, and refracted on the bottom surface 31 to make incident on the white color LED package 2w.

In an exemplary case of a light beam Ray5, the light inclinedly emitted from the ultraviolet LED package 2u is Fresnel reflected by the bottom surface 31 to make incident on the white color LED package 2w.

In an exemplary case of a light beam Ray6, the light emitted from the side surface 2ucs of the sealing glass of the ultraviolet LED package 2u is made directly incident on the white color LED package 2w. In the embodiment, as the ultraviolet LED package 2u is provided with the sealing glass, its thickness is larger than that of the white color LED package 2w, and has its light emission surface structured similarly to the dichroic prism, resulting in the path as indicated by the light beam Ray6.

The new problem is to be solved by suppressing ultraviolet light beams incident on the white color LED package 2w through various paths. In order to solve the problem, the light shielding frame 5 is further designed in the embodiment for forming the light shielding unit disposed between the light emission surface of either the white color LED package 2w or the ultraviolet LED package 2u, and the dichroic prism 3.

The light shielding frame 5 of the embodiment will be described referring to FIGS. 3A to 3E, and 4. FIGS. 3A to 3E are drawings each showing a structure of the light shielding frame 5. FIG. 4 represents how the light beam is shielded by the light shielding frame 5.

Figure 3A:
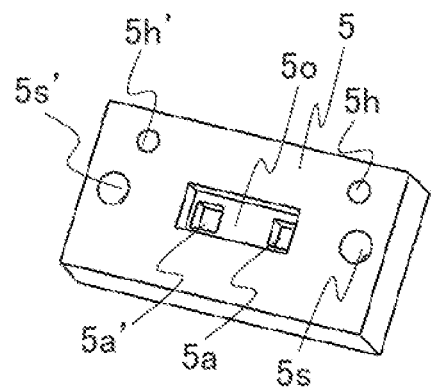
FIGS. 3A to 3E are drawings each showing an example of a light shielding structure of the first embodiment.
Figure 3B:
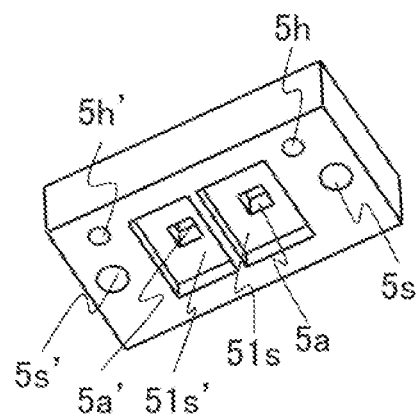
Figure 3C:
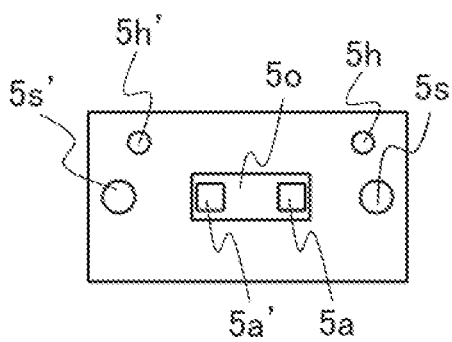
Figure 3D:
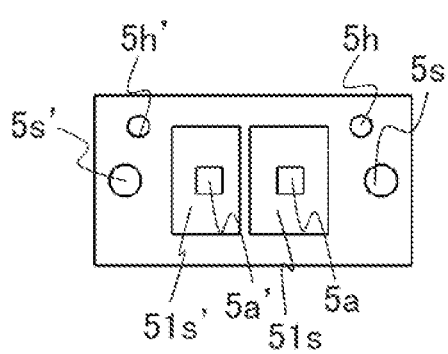
Figure 4:
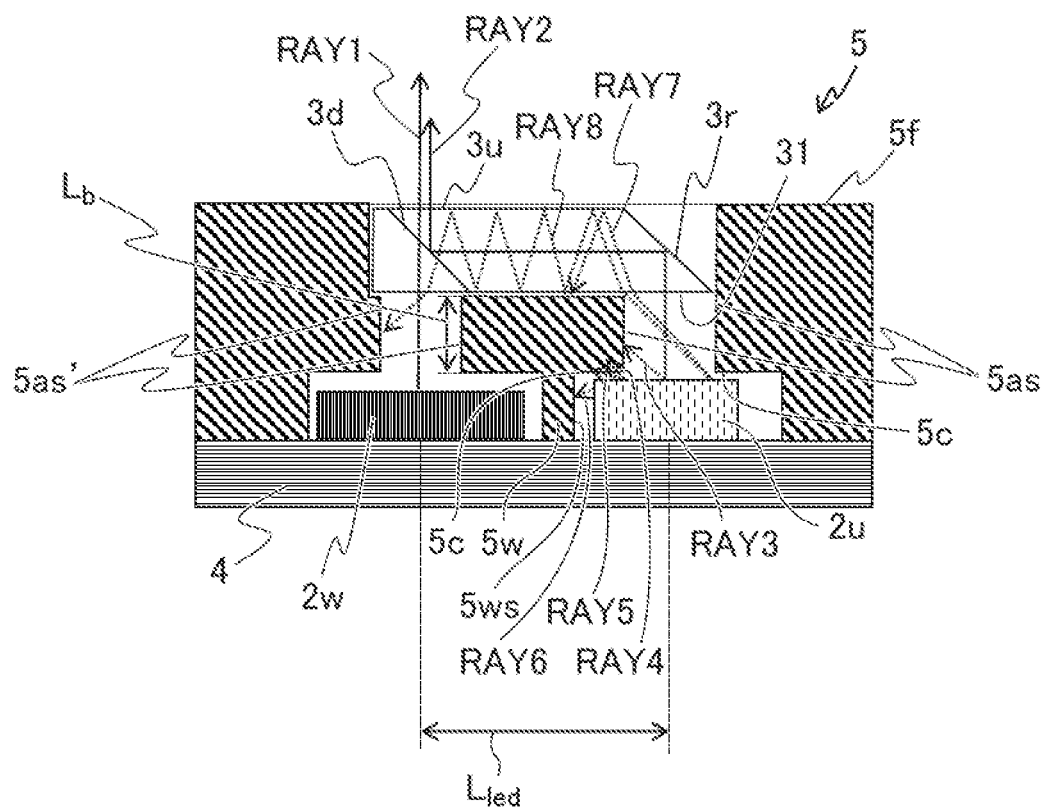
FIG. 4 is a drawing that explains ultraviolet light suppression by a light shielding structure of the first embodiment.

FIG. 3A is a perspective view of the light shielding frame 5 when seen from the side at which the dichroic prism 3 is disposed. FIG. 3B is a perspective view when seen from the side at which the LED substrate 4 is disposed. FIG. 3C is a front view of the light shielding frame 5 when seen from the side of the dichroic prism 3. FIG. 3D is a rear view when seen from the side of the LED substrate 4.

As FIG. 1 shows, the dichroic prism 3 is fitted with a recess part of an opening 5o.

Highly accurate formation of the recess part allows the dichroic prism 3 to be disposed to a given position with high accuracy. Through holes 5a, 5a' are holes which allow penetration of light beams from the ultraviolet LED package 2u and the white color LED package 2w so that the light beams reach the dichroic prism 3. That is, the light shielding frame 5 is provided to fix the dichroic prism 3 as the member having the reflection surface and the dichroic surface. The light shielding frame 5 has the through holes which allow penetration of the light beams from the first LED or the second LED so that the light beams reach the reflection surface 3r and the dichroic surface 3d.

Meanwhile, screw holes 5s, 5s' serve to fix the LED substrate 4 to the light shielding frame 5. That is, the light shielding frame 5 includes the screw holes for fixing the LED substrate 4 which furnishes the first LED to the light shielding frame 5. As the position of the screw hole is machined with high accuracy, the positional relationship between the LED substrate 4 and the light shielding frame 5 is attained highly accurately. Guides 5h, 5h' are holes to align the light source 1 with the structure of the rear stage optical system of the biochemical analyzer. The holes described herein may be the through hole for fixation. Alternatively, a protrusion may be used as the guide.

An explanation will be made with respect to prevention of misalignment or rattling of the dichroic prism 3 caused by vibration. An adhesive is applied to a flat portion between the through holes 5a and 5a' of the recess part to fix the dichroic prism 3 so as not to cause rattling. Generally, adhesion of the light guiding member causes scattering, and leakage of light from the member, resulting in lowered light utilization efficiency. Considering the structure up to the rear stage optical system of the biochemical analyzer, among light beams emitted from the effective region 3ea, the light only at the angle of several degrees or less from the normal direction of the upper surface 3u is usable in the rear stage optical system.

This reveals that the effective light beam is only the one that follows the path where the light beam is reflected by the reflection surface 3r and the dichroic surface 3d at approximately 45°, for example, the light beam Ray2 as indicated by FIG. 1B. The light scattering at the adhered position is not efficiently utilized, and accordingly, such light does not influence the light utilization efficiency of the analyzer. For that reason, the fixed surface as the flat portion between the through holes 5a and 5a' is adhered to the dichroic prism 3.

That is, the fixing surface opposite to the dichroic prism is located between the first and the second through holes. The fixing surface and the dichroic prism 3 are adhered to each other.

This structure provides an effect of suppressing rattling of the component without influencing the light utilization efficiency of the analyzer.

Figure 3E:
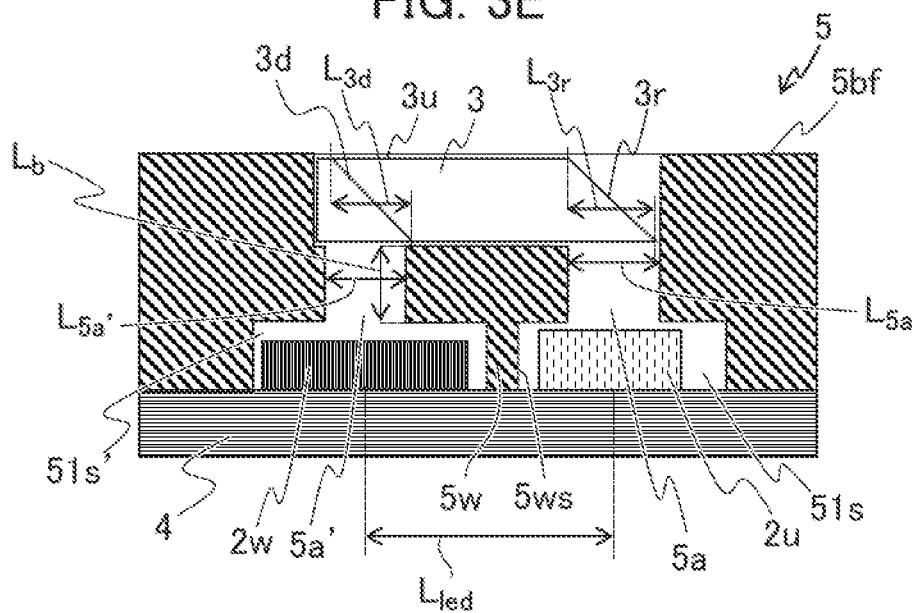

A positional relationship among the dichroic prism 3, the light shielding frame 5, and the two LED packages will be described referring to FIG. 3E. FIG. 3E corresponds to FIG. 1B, which shows the section related only to the explanation about the structure between screw holes 5s and 5s'.

Each size of the through holes 5a, 5a' is made slightly larger than each size of the LED 2wl and LED 2ul as shown in FIG. 1 for the purpose of suppressing the influence of misalignment of the LED 2wl and LED 2ul owing to furnishing error on the efficiency. Based on the examination, it is preferable to impart an allowance of approximately 0.3 mm to each of widths $L_{5a}$ and $L_{5a'}$ of the through holes so that the size is determined by adding 0.6 mm to the width of the LED, that is, LED width+0.6 mm. Using $L_{2ul}$ and $L_{2wl}$ shown in FIG. 1, and $L_{5a}$ and $L_{5a'}$ shown in FIG. 3, relationships of $L_{5a}=L_{2ul}+0.6$ mm, and $L_{5a'}=L_{2wl}+0.6$ mm are established. That is, each width of the through holes corresponding to the first and the second LEDs is made larger than each width thereof.

Assuming that the width of the through hole is substantially the same as that of the light emission surfaces 2wpu and 2ucu, substantially all the emitted light beams can be guided to the dichroic prism 3. In the embodiment, each of the widths $L_{5a}$ and $L_{5a'}$ of the through holes is reduced to be slightly larger than each of the widths $L_{2ul}$, $L_{2wl}$ of the LEDs as shown in FIG. 1. The respective sizes are set as described above on the ground that the emitted light intensity from the light emission surface right above the LED is higher than that of the other part. The area of the effective region 3ea as shown in FIG. 1E is determined substantially in accordance with the rear stage optical system. In many cases, the resultant width becomes substantially the same as that of the LED. In this case, the light beam emitted from the light emission surface right above the LED can only be effectively utilized. Although the width of the through hole is made larger than that of the LED, the effect of improving the light utilization efficiency is low. In consideration of the circumstances, the smaller each of the widths $L_{5a}$ and $L_{5a'}$ of the through holes becomes, the smaller the quantity of light beam emitted from the ultraviolet LED package 2u to reach the white color LED package 2w becomes. Accordingly, the width $L_{5a}$ of the through hole is set to be slightly larger than the width $L_{2ul}$ of the LED, and the width $L_{5a'}$ of the through hole is set to be slightly larger than the width $L_{2wl}$ of the LED as shown in FIG. 1.

Widths $L_{3r}$ and $L_{3d}$ of the reflection surface $3r$ and the dichroic surface $3d$ of the dichroic prism 3 are set to be slightly larger than the widths $L_{5a}$ and $L_{5a'}$ of the through holes, respectively. Specifically, each of the widths $L_{3r}$ and $L_{3d}$ is set by adding approximately +0.4 mm to each of the widths $L_{5a}$ and $L_{5a'}$ of the through holes, respectively. This value is set in consideration of positioning errors which occur when disposing the dichroic prism 3 in the light shielding frame 5. That is, the width of the reflection surface or the width of the dichroic surface is made larger than the corresponding width of the through hole.

As another characteristic of the light shielding frame 5, a light shielding wall $5w$ is provided between the ultraviolet LED package $2u$ and the white color LED package $2w$ while extending from the light emission surface of the ultraviolet LED package $2u$ toward the LED substrate 4. The light shielding wall suppresses the light emitted from the ultraviolet LED package $2u$ from reaching the white color LED package $2w$ as stray light.

An explanation will be made with respect to how the light shielding frame 5 shields light beams referring to FIG. 4. FIG. 4 shows the same section as the one shown in FIG. 3E. The light beam Ray3 of FIG. 2 is shielded by a side surface $5as$ of the through hole. That is, formation of the through hole $5a$ provides the effect of reducing ultraviolet light that reaches the white color LED package $2w$. The through hole $5a$, and the side surface $5as$ that constitutes the through hole $5a$ correspond to the light shielding unit of the light source 1 of the embodiment.

The light beams Ray4 and Ray5 are shielded by a part $5c$ of the light shielding frame 5, which is opposite to the light emission surface $2ucu$. That is, the part $5c$ opposite to the light emission surface $2ucu$ provides the effect of reducing ultraviolet light that reaches the white color LED package $2w$. In this case, the part $5c$ of the light shielding frame 5, which is opposite to the light emission surface $2ucu$ corresponds to the light shielding unit of the light source 1 of the embodiment.

The light beam Ray6 is shielded by the light shielding wall $5w$. That is, the light shielding wall $5w$ provides the effect of reducing ultraviolet light that reaches the white color LED package $2w$. In this case, the light shielding wall $5w$ corresponds to the light shielding unit of the light source 1 of the embodiment.

In an exemplary case of a light beam Ray1, after incidence on the dichroic prism 3, it is Fresnel reflected by the upper surface $3u$, emitted from the bottom surface 31, and shielded by the part of the light shielding frame 5, which is opposite to the bottom surface 31. Each of the widths $L_{5a}$ and $L_{5a'}$ of the through holes is made slightly larger than each of the widths $L_{2ul}$, $L_{2wl}$ of the LEDs so that a part of the light shielding frame 5 exists opposite to the bottom surface 31. This provides the effect of reducing ultraviolet light that reaches the white color LED package $2w$. The part of the light shielding frame 5 opposite to the bottom surface 31, in other words, the surface between the through holes $5a$ and $5a'$, which is opposite to the dichroic prism 3 corresponds to the light shielding unit of the light source 1 of the embodiment.

After incidence on the dichroic prism 3, a light beam Ray8 is Fresnel reflected repeatedly between the upper surface $3u$ and the bottom surface 31, penetrates through the dichroic surface $3d$, made incident on the through hole $5a'$ from the bottom surface 31, and shielded by a side surface $5as'$ of the through hole. The through hole slightly larger than the width $L_{2wl}$ of the LED is formed in the white color LED package $2w$ to provide the effect of reducing ultraviolet light that reaches the white color LED package $2w$ by the side surface $5as'$ for shielding the light beam incident on the through hole $5a'$ after penetrating through the dichroic surface $3d$. The through hole $5a'$, and the side surface $5as'$ that constitutes the through hole $5a'$ correspond to the light shielding unit of the light source 1 of the embodiment.

Materials for forming the light shielding frame 5 will be described. It is preferable to use the member that is hardly deteriorated by ultraviolet light, allows no penetration of ultraviolet light, and exhibits low reflection factor with respect to ultraviolet light, for example, the member derived from applying the surface treatment on the metal like the aluminum block for lowering the reflection factor with respect to ultraviolet light. Other materials include inorganic materials such as ceramic and glass. Preferably, the ceramic and the glass serve to absorb ultraviolet light without allowing penetration, or to attenuate ultraviolet light. Generally employed glass except quartz exhibits high absorptivity of ultraviolet light. The resin is the most likely to be deteriorated by ultraviolet light. As the metal and the inorganic material are resistant to ultraviolet light, it is preferable to use the metal or the inorganic material as the one expected to be continuously exposed to ultraviolet light.

Figure 5:
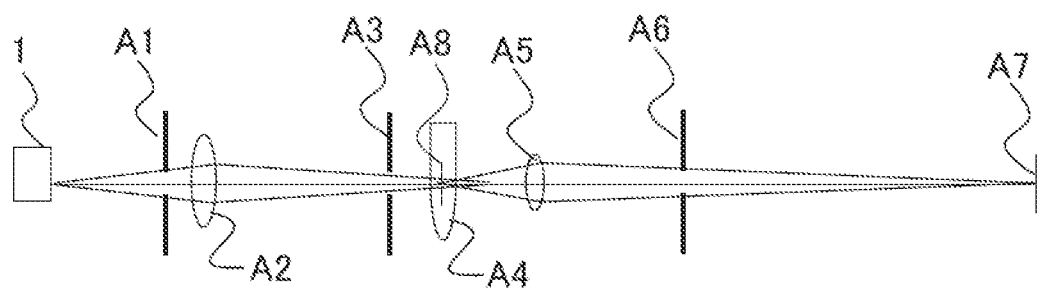
FIG. 5 is a drawing that shows an optical system simulating a light source of the first embodiment.

An explanation will be made with respect to results of simulating the light utilization efficiency of light emitted from the ultraviolet LED package $2u$, and quantity of ultraviolet light that reaches the light emission surface $2wpu$ of the white color LED package $2w$. FIG. 5 schematically shows the simulated optical system. The light source 1 has the structure as shown in FIGS. 1 and 3E. It is assumed that a distance $L_{led}$ between the LEDs is set to 6 mm, and each height $L_b$ of the through holes $5a$, $5a'$ is set to 2.1 mm. The section including a first aperture stop A1 onward refers to the rear stage optical system of the biochemical analyzer. Referring to the drawing, codes A2 to A8 denote an irradiation lens system, a second aperture stop, a sample cell, a detection lens system, a third aperture stop, a light detector, and an imaginal plane, respectively. The biochemical analyzer includes the sample cell, and the lens for illuminating the sample cell using the light beam (beam) emitted from the dichroic surface.

The light utilization efficiency and the quantity of ultraviolet light that reaches the light emission surface $2wpu$ are defined as follows. Assuming that the total quantity of light emitted from the LED $2ul$ of the ultraviolet LED package $2u$ is 100%, the light utilization efficiency is defined as the proportion of quantity of light that reaches the light detector A7, and the ultraviolet light quantity is defined as the proportion of quantity of light that reaches the light emission surface $2wpu$, respectively. Light is emitted from the upper surface of the LED $2ul$ so that the light emission angle distribution is formed as the Lambert distribution.

An optical axis of the optical system as shown in FIG. 5 passes through the center of the white color LED package $2w$ as shown in FIG. 3E. The white color LED package $2w$ is aligned with the optical axis to maximize the light utilization efficiency of light emitted from the white color LED package because of the following reason. The white color LED package $2w$ emits light with wavelength in the wider range compared with the ultraviolet LED package $2u$, which may cause the risk of insufficient quantity of light of the white color LED package $2w$.

The light emitted from the upper surface $3u$ opposite to the dichroic surface $3d$ of the light source 1 is limited by the first aperture stop A1. Then the irradiation lens system A2 focuses light so that the sample cell A4 is appropriately irradiated. The second aperture stop A3 is disposed in front of the sample cell A4. The single lens may be used for forming the irradiation lens system A2. In many cases, however, a plurality of lenses are used for forming the irradiation lens system for the purpose of aberration correction. The light penetrating through the sample cell A4 is focused by the detection lens system A5 at the light detector A7. The single lens may be used for forming the detection lens system A5 as well. In many cases, however, a plurality of lenses are used for forming the detection lens system for the purpose of aberration correction. The third aperture stop A6 is disposed in front of the light detector A7.

The effective region 3ea of the optical system is a substantially 1 mm square. Among light beams penetrating through the effective region 3ea, only the one at the angle within several degrees or less from the normal line of the upper surface 3u is effectively utilized. Accordingly, the light utilization efficiency is less than 1%.

Table 1 represents calculation results. Results of the case in the absence of the light shielding frame 5 are represented as a comparative example. According to the comparison of those cases, values of the light utilization efficiency have no difference irrespective of existence of the light shielding frame 5. The quantity of ultraviolet light that reaches the light emission surface 2wpu of the white color LED package 2w in the presence of the light shielding frame 5 is reduced by the amount less than ¹⁄₁₀.

TABLE 1

Comparison of ultraviolet light quantity between cases in the presence/absence of light shielding frame

| | light utilization efficiency | quantity of ultraviolet light on light emission surface |
|---|---|---|
| absence of light shielding frame | 0.06% | 0.56% |
| presence of light shielding frame | 0.06% | 0.05% |

The results show that the light shielding frame 5 functioning as the light shielding unit disposed between the light emission surfaces of the two LED packages and the dichroic prism provides the effect of suppressing UV deterioration of the resin 2wp by reducing quantity of ultraviolet light that reaches the white color LED package 2w. The results further show that the new problem of the light source 1 can be alleviated. Specifically, light beams emitted from LEDs of multiple types are combined into the single light beam (beam), and allowed to be made incident on the rear stage optical system of the biochemical analyzer. This attains the light source using the long-life LED instead of the short-life tungsten lamp.

The light source includes the ultraviolet LED package 2u (LED 2ul) and the white color LED package 2w (LED 2wl) that are arranged in parallel, the reflection surface 3r opposite to the LED 2ul to reflect light emitted therefrom, and the dichroic surface that is opposite to the LED 2wl to reflect the light from the LED 2ul, and to allow penetration of the light from the LED 2wl. Assuming that the optical member including the reflection surface 3r that reflects light from the LED 2ul toward the LED 2wl, and the dichroic surface 3d is called the dichroic prism 3, the light source that includes the light shielding unit disposed between the light emission surface of the LED 2ul or the LED 2wl and the dichroic prism 3 allows the use of the long-life LED instead of the short-life tungsten lamp.

In other words, the light source includes the ultraviolet LED package 2u (LED 2ul) and the white color LED package 2w (LED 2wl) that are disposed in parallel, the reflection surface 3r opposite to the LED 2ul to reflect light emitted therefrom, and the dichroic surface that is opposite to the LED 2wl to reflect the light from the LED 2ul and to allow penetration of the light from the LED 2wl. The light source further includes the light shielding unit for shielding ultraviolet light located closer to the LED 2ul or the LED 2wl than the reflection surface 3r and the dichroic surface 3d. The light shielding unit opposite to the light emission surface of the LED 2ul or the LED 2wl provides the effect of attaining the light source using the long-life LED instead of the short-life tungsten lamp.

The light shielding frame 5 is the member serving to reduce quantity of ultraviolet light that reaches the white LED package 2w, and to fix the dichroic prism 3 to be disposed on the LED package at the given position. The structure of the embodiment using the light shielding frame serving as the light shielding unit provides the effect of solving two problems, that is, by suppressing UV deterioration, and arranging the dichroic prism 3 and multiple LEDs with high accuracy.

[Modification of Through Hole]

Figure 6:
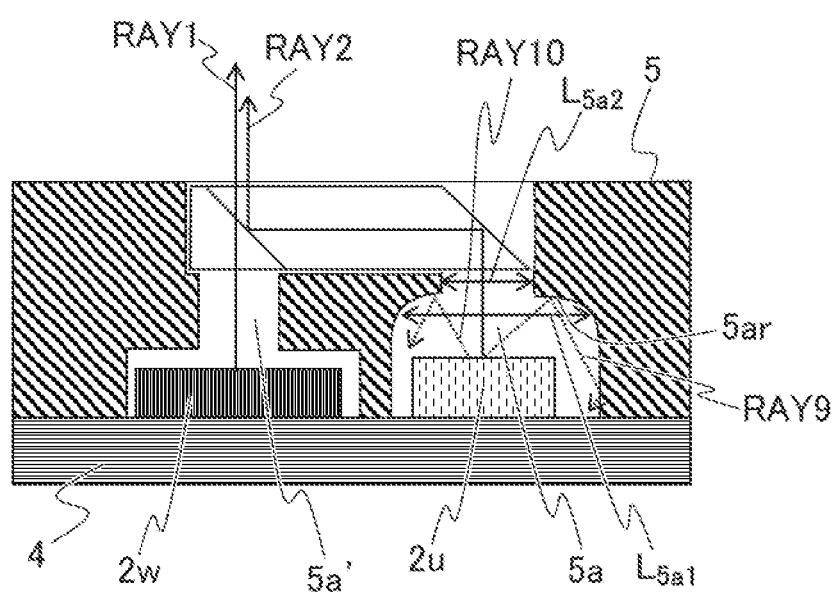
FIG. 6 is a drawing that shows a modification of a through hole of a light source of the first embodiment.

The through hole 5a of the first embodiment has a quadrangular shape. The shape of the through hole 5a is not limited to the one as described above, and may be polygonal, columnar, and elliptical cylindrical. The through hole can be formed into the non-simple shape like the modification as shown in FIG. 6. The through hole 5a penetrates through the (light shielding) frame as a minimum required function. Accordingly, various modifications can be made.

If the reflection factor of the light shielding frame 5 is not sufficiently low, light propagates a certain distance while being absorbed by the side surface 5as of the through hole. This allows the light to reach the white color LED package 2w. In order to reduce such light, the through hole 5a as shown in FIG. 6 may be designed. The through hole structure is intended to reflect the light emitted from the ultraviolet LED package 2u to be returned to the LED substrate 4. The through hole 5a at the side of the ultraviolet LED package 2u is larger (hole diameter) than the hole at the position close to the dichroic prism 3. The structure is characterized by the size of the hole that varies in accordance with the position. That is, the size of the through hole varies in accordance with the position in the depth direction of the through hole. Making an explanation referring to FIG. 6, the hole diameter $L_{5a1}$ at the side of the ultraviolet LED package 2u is larger than the hole diameter $L_{5a2}$ at the side closer to the dichroic prism 3.

The structure of the modification provides a reflection surface 5ar formed on the light shielding frame 5. The reflection surface 5ar is allowed to reflect ultraviolet light toward the LED substrate 4 like the light beam Ray9 or Ray10. This provides the effect of reducing the quantity of ultraviolet light that reaches the white color LED package 2w. The reflection surface 5ar corresponds to the light shielding unit of the light source 1 of the modification.

SECOND EMBODIMENT

A second embodiment is intended to allow an image of the light source projected to the sample cell A4 from the ultraviolet LED package 2u to match the one from the white color LED package 2w. In the embodiment, the light source includes a diffusion plate for diffusing light, which is opposite to the first LED or the second LED for diffusing light.

A problem to be solved in the second embodiment will be described referring to FIG. 5 that has been used for explaining the optical system. It is assumed that the sample cell A4 has the imaginal plane A8 as shown in FIG. 5. The white color LED package 2w is arranged to exist on the optical axis, and have a center of the LED 2wl of the white color LED package 2w aligned with the optical axis. An image of the light emission surface of the white color LED package 2w is directly projected. Specifically, when using a square LED as the excitation light source, the bright square image is projected onto the imaginal plane A8.

The LED 2ul furnished in the ultraviolet LED package 2u at a given position is projected so as to be superposed on the image of the LED 2wl of the white color LED package 2w. However, those images cannot be necessarily superposed exactly owing to a positional displacement that occurs when furnishing the ultraviolet LED package 2u. Each light emitted from the two packages is projected to the same position on the sample cell A4 so that the same position of the sample cell A4 can be inspected. Generally, the analyzer performs analysis of a constituent of the sample cell A4 from the difference in intensity among multiple wavelengths. Preferably, light is projected to the same position on the sample cell A4 so that the light detector receives the penetrating light from such position. The structure has been designed to enlarge the image of the ultraviolet LED package 2u so that the entire image of the white color LED package 2w is covered even if those images cannot be superposed exactly.

Figure 7:
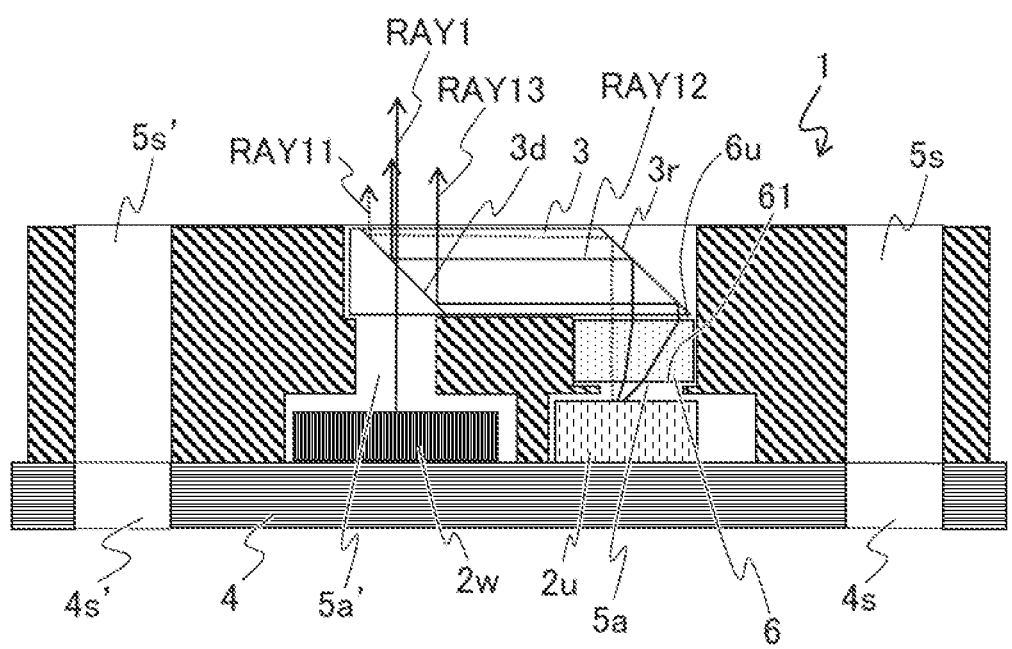
FIG. 7 is a drawing that shows a configuration example of a light source of the second embodiment.

FIG. 7 is a sectional view of an exemplary structure of the light source 1 of the second embodiment to which the above-described characteristic is applied. The second embodiment is different from the first embodiment in that the ultraviolet LED package 2u is disposed at the displaced position, and that the diffusion plate 6 is employed, which deforms the shape of the through hole 5a for diffusing light between the dichroic prism 3 and the ultraviolet LED package 2u.

As the diffusion plate 6 causes scattering to change the travel direction of the light beam, the resultant light source image spreads in the blurry state. The diffusion plate 6 has several types including the one having its surface uneven by which light is scattered, the one having scattering particles dispersed in the plate material, by which light is scattered, and the one of hybrid type formed by combining the above-described types. The diffusion plate of any type is allowed to control dispersibility by adjusting roughness of the uneven surface, and the scattered particle concentration. It is possible to use the diffusion plate 6 of arbitrary scattering type as the one according to the second embodiment so long as it is basically formed as the member to perform the light scattering function.

In this embodiment, an exemplary diffusion plate 6 has an upper surface 6u and a lower surface 6l each made of unevenly surfaced quartz glass. The material for forming the diffusion plate 6 includes sapphire, $CaF_2$, magnesium fluoride glass, and ultraviolet-transmitting glass. However, the material for forming the diffusion plate 6 of the embodiment is not limited to those materials.

The reason of spreading of the light source image will be described referring to light beams Ray2, Ray11, and Ray12 as shown in FIG. 7. Each of those light beams is the one emitted from the position around the center of the positionally displaced ultraviolet LED package 2u. Intensity of the light beam emitted from the position around the center is high. In order to improve the light utilization efficiency, it is essential to emit those light beams from the light source 1 so that they can be utilized by the rear stage optical system. In many cases, those light beams form the brightest part of the LED image.

The Ray11 represents propagation under substantially no influence of scattering, indicating the light beam path in the absence of the diffusion plate 6. In this case, it is emitted at the position different from the one from which the light beam Ray1 with high intensity is emitted from the center of the white color LED package 2w. Accordingly, the position of the image on the imaginal plane A8 is different. However, scattering generates the light beam at the emission position aligned with the light beam Ray1 like the light beam Ray12. Accordingly, the resultant images partially match. The high intensity light such as the light beam Ray13, which is located around the center is emitted from the dichroic prism 3 in a broad range under the influence of light scattering. The resultant image is enlarged in the blurry state.

The diffusion plate 6 disposed between the dichroic prism 3 and the ultraviolet LED package 2u provides the effect of enlarging the image in the blurry state so that the superposed region of the white color LED package 2w and the ultraviolet LED package 2u is increased. The structure employs the LEDs of multiple types, and makes a plurality of light beams emitted from those LEDs incident on the rear stage optical system of the biochemical analyzer as the single light beam (beam) to allow multiple images to be superposed on the sample cell A4. As a result, the embodiment provides the effect of attaining the light source using the long-life LED instead of the short-life tungsten lamp.

THIRD EMBODIMENT

Figure 8:
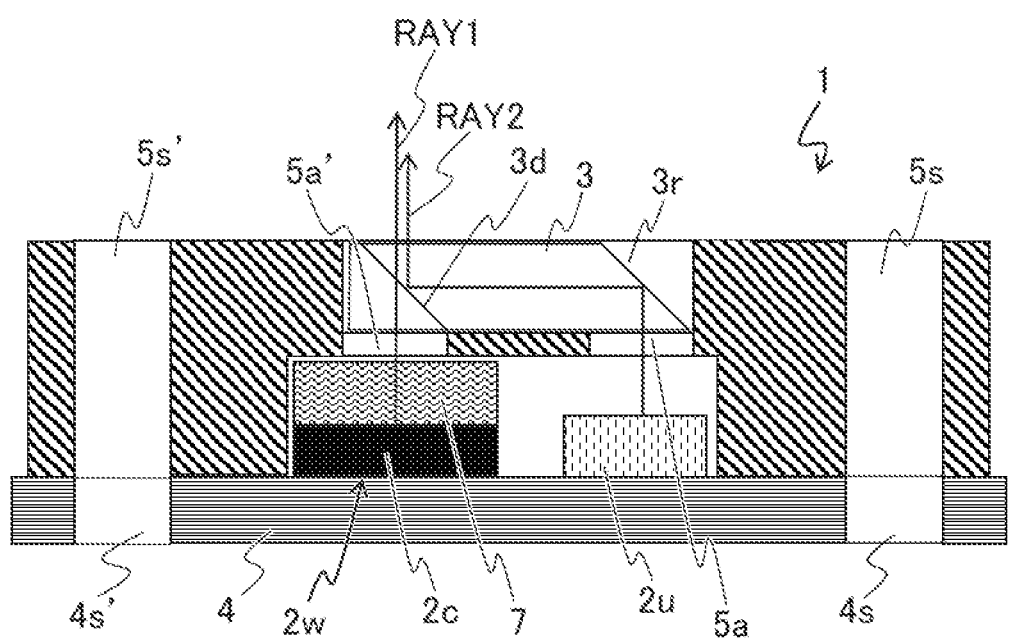
FIG. 8 is a drawing that shows a configuration example of a light source of the third embodiment.

In a structure of a third embodiment, the white color LED package 2w is provided with a light shielding unit. The structure will be described referring to FIG. 8. This embodiment is different from the first embodiment in that each height of the through holes 5a, 5a' is lowered, the white color LED is covered with a coating member impenetrable to ultraviolet light, that is, the outer surface of the white color LED package 2w is coated with a coating member 2c impenetrable to ultraviolet light and hardly deteriorated thereby, and a filter member 7 is provided to pass light with wavelength of approximately 370 nm or longer, and to reflect or absorb other light with shorter wavelength. The height of the through hole is lowered for the purpose of forming the space where the filter member 7 is disposed.

Preferably, the coating member 2c is a metal evaporated film such as aluminum and gold. The evaporated film has its thickness of 10 nm or larger, and preferably, approximately 100 nm. The member having the dichroic surface can be employed for the filter member 7. However, as there may be the case where the filter member passes inclinedly incident ultraviolet light, it is preferable to employ the member that passes light with wavelength of 380 nm or longer, and absorbs ultraviolet light with wavelength of approximately 340 nm or shorter. Glass can be used as one of those materials. Preferably, the glass has its thickness of 1 mm or larger for the purpose of sufficiently absorbing ultraviolet light. The glass material includes alkali-free glass, soda-lime glass, borosilicate glass, and heat-resistant glass. Silicone resin and acryl can be used as another example. The material for forming the filter member 7 in this embodiment, however, is not limited to those materials.

The light source includes the parallel-disposed first LED and the second LED having a light emission spectrum different from that of the first LED, one of which emits ultraviolet light. The light source further includes the reflection surface opposite to the first LED to reflect light therefrom, and the dichroic surface opposite to the second LED to reflect light from the first LED and to allow penetration of light from the second LED. The other one of the first LED and the second LED is the white color LED for mainly emitting light other than ultraviolet light. The filter member is disposed opposite to the light emission surface of the white color LED, which has the penetration efficiency to ultraviolet light lower than the penetration efficiency with respect to light with wavelength longer than that of ultraviolet light.

The structure allows the coating member 2c to protect the outer surface of the white color LED frame 2wf from being irradiated with ultraviolet light. The filter member 7 provides the effect of reducing exposure of the light emission surface 2wpu to ultraviolet light. In this structure, the light shielding unit of the light source 1 corresponds to the coating member 2c and the filter member 7. The filter member 7 as the light shielding unit of the light source 1 of the embodiment is disposed between the LED 2wl and the dichroic prism 3 to provide the effect of reducing quantity of ultraviolet light.

FOURTH EMBODIMENT

A fourth embodiment is different from the first embodiment mainly in the use of an LED package 2pk having two LEDs 2wl and 2ul each having different light emission wavelength furnished instead of using the two LED packages 2w and 2u, each having different light emission wavelength. Specifically, the fourth embodiment represents an exemplary light source having the first and the second LEDs furnished in one package while having a wall surface disposed therebetween.

Figure 9A:
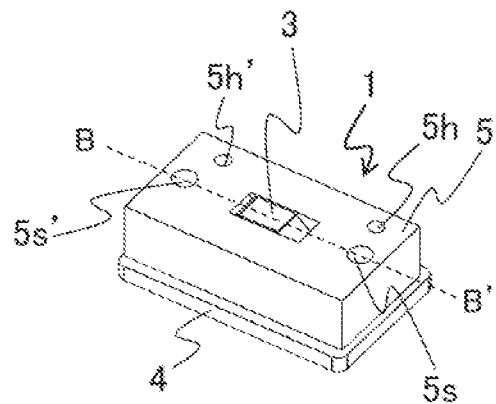
FIGS. 9A to 9C are drawings each showing a configuration example of a light source of the fourth embodiment.
Figure 9B:
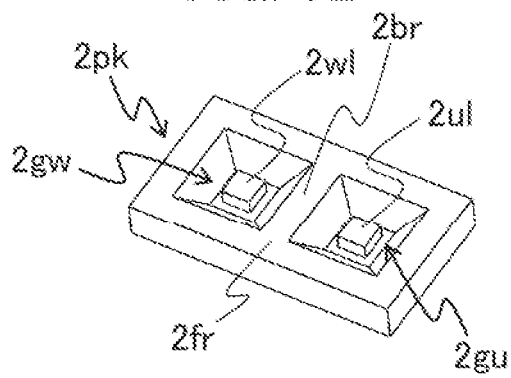
Figure 9C:
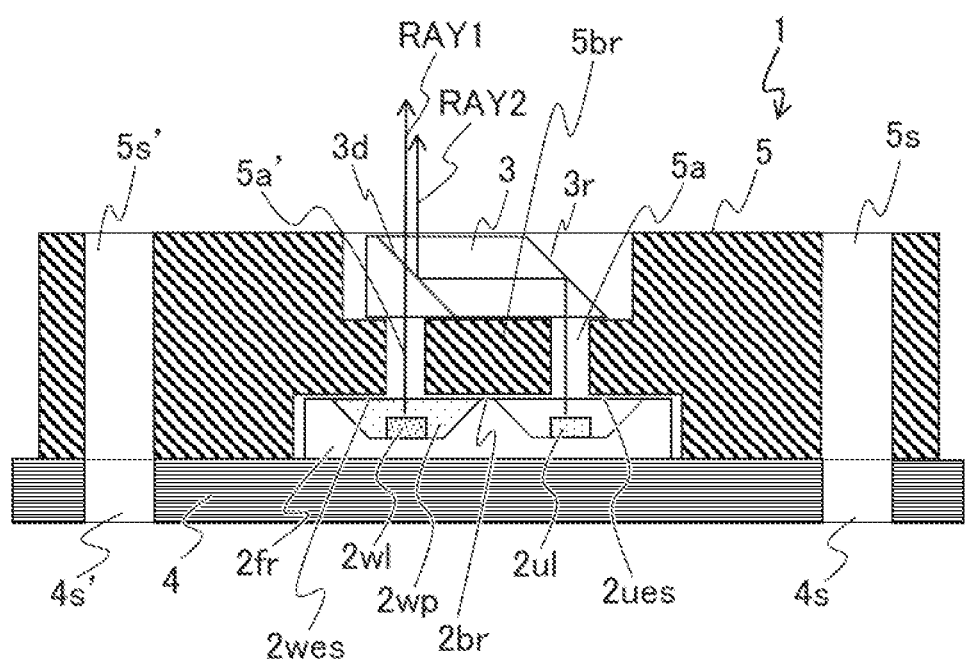

A structure of the embodiment will be described referring to FIGS. 9A to 9C. FIG. 9A is a perspective view of the light source 1 of the embodiment, FIG. 9B is a detailed view of the LED package 2pk, and FIG. 9C is a sectional view taken along line B-B' of FIG. 9A.

The LED package 2pk will be described referring to FIGS. 9B and 9C. The LED package 2pk of the embodiment is characterized in that a wall surface 2br is formed between the LED 2wl and the LED 2ul for the purpose of suppressing deterioration in the peripheral member of the LED 2wl by ultraviolet light from the LED 2ul.

A casing 2fr of the LED package 2pk is made of the member that hardly suffers from deterioration by ultraviolet light, for example, the ceramic. The material for forming the member includes AlN, $Al_2O_3$, sapphire, ceramic, Al, and Cu. In the disclosure, the material is not limited to those described above.

Recess parts are formed in two sections of the casing 2fr. The LEDs 2wl and 2ul are disposed on bottom surfaces of the recess parts, respectively. The recess part 2gw in which the LED 2wl is disposed is filled with a phosphor-dispersed resin 2wp. The phosphor is excited by light from the LED 2wl so that light beams generated by both the LED 2wl and the phosphor are emitted from the light emission surface 2wes of the recess part 2gw.

The recess part 2gu in which the LED 2ul is disposed may or may not be sealed with UV resistant resin or glass. For example, such resin includes fluoroplastic resin, silicone resin, epoxy resin, acrylic resin, and cycloolefin resin. In the present disclosure, the material is not limited to those described above. A cover glass (not shown) such as the quartz may be provided to cover the light emission surface 2ues of the recess part 2gu. It is also possible to apply the cover glass to the entire surface of the light emission surface of the LED package 2pk.

The structure of the embodiment having the single LED package is advantageous in regard to compactness and easy handling. The structure further generates light with wavelength required for the respective recess parts, and ensures to suppress UV deterioration of the phosphor-dispersed resin 2wp.

The LED package of the embodiment, which is disposed as shown in FIG. 9C ensures to suppress ultraviolet light of the recess part 2gu from reaching the recess part 2gw. The through holes 5a' and 5a are formed corresponding to the LEDs 2wl and 2ul, respectively. A light shielding unit 5br at the center is disposed opposite to the wall surface 2br. As the light shielding unit 5br at the center and the wall surface 2br are adjacently positioned, ultraviolet light emitted from the LED 2ul is absorbed or reflected by the through holes 5a', 5a, the light shielding unit 5br at the center, and the wall surface 2br so as to reduce ultraviolet light that reaches the recess part 2gw.

The light source 1 includes the LED 2ul for emitting ultraviolet light, and the LED 2wl having a light emission spectrum different from that of the LED 2ul, which are disposed in parallel, the reflection surface 3r opposite to the LED 2ul to reflect the light therefrom, and the dichroic surface 3d opposite to the LED 2wl to reflect light from the LED 2ul, and to allow penetration of light from the LED 2wl. Assuming that the optical member having the dichroic surface 3d is called the dichroic prism 3, the light source 1 is characterized in that the reflection surface 3r reflects light from the LED 2ul toward the LED 2wl, and the light shielding unit 5br is disposed between the light emission surface of the LED (2ues or 2wes) and the dichroic prism 3. This provides the effect of reducing quantity of ultraviolet light that reaches the recess part 2gw, and suppressing UV deterioration of the resin 2wp. This makes it possible to combine the light beams emitted from the LEDs of multiple types into the single light beam (beam) so as to be made incident on the rear stage optical system of the biochemical analyzer. This further provides the effect of attaining the light source using the long-life LED instead of the short-life tungsten lamp.

In other words, the light source includes parallel-disposed LEDs 2ul and 2wl, the reflection surface 3r opposite to the LED 2ul to reflect light therefrom, the dichroic surface 3d opposite to the LED 2wl to reflect light from the LED 2ul, and to allow penetration of light from the LED 2wl, and the light shielding unit for shielding ultraviolet light. The light shielding unit is located closer to the LED 2ul or the LED 2wl than the reflection surface 3r and the dichroic surface 3d while being opposite to the light emission surface of the LED 2ul or the LED 2wl. This provides the effect of attaining the light source using the long-life LED instead of the short-life tungsten lamp.

[Modification of Light Shielding Frame]

Figure 10A:
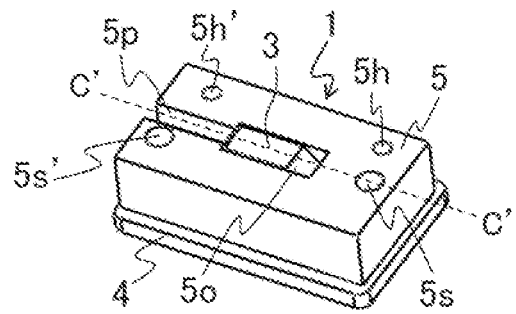
FIGS. 10A to 10D are drawings each showing a modification of a light shielding frame of a light source of the fourth embodiment.
Figure 10B:
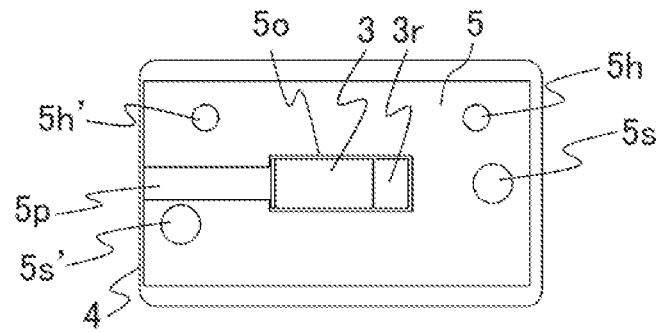
Figure 10C:
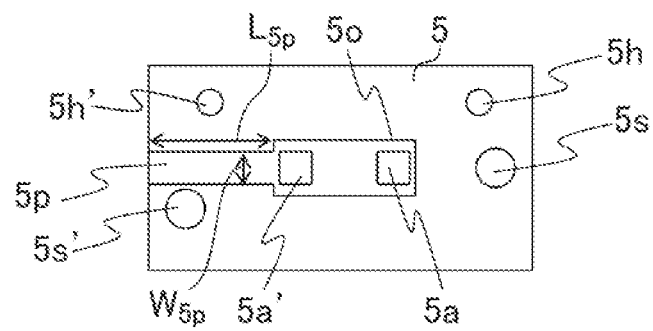
Figure 10D:
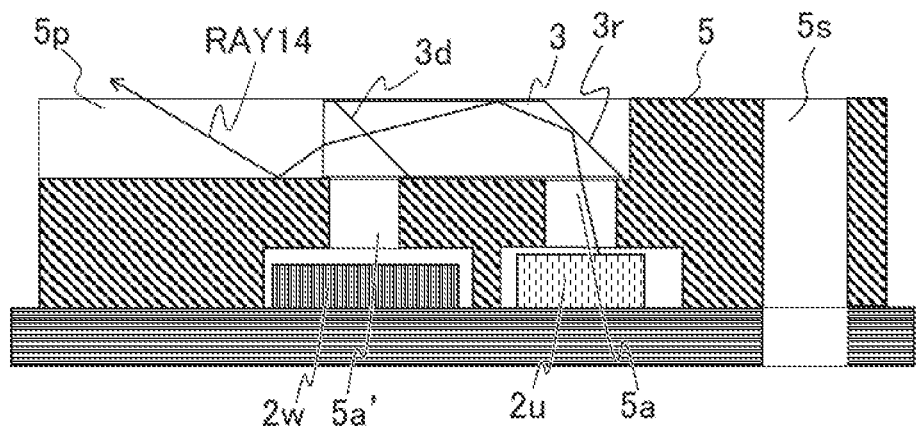

An explanation will be made with respect to the shape around the opening 5o of the light shading frame 5 for releasing ultraviolet light passing through the dichroic surface 3d to the outside as a modification referring to FIGS. 10A to 10D. FIG. 10A is a perspective view of the light source 1 of the embodiment, FIG. 10B is a front view, FIG. 10C is a front view of the shielding frame 5, and FIG. 10D is a sectional view taken along line C-C' of FIG. 10A. The modification is different from the first embodiment mainly in an ultraviolet light emission path 5p formed in the shielding frame 5.

A part of ultraviolet light reflected by the reflection surface 3r penetrates through the dichroic surface 3d in accordance with the incident angle thereon. The penetrating light is emitted from the dichroic prism 3 to the outside. In the case where the light shielding frame 5 has the structure as shown in FIG. 1, the light emitted to the outside is reflected by the wall surface of the light shielding frame 5. If the reflection factor of the light shielding frame 5 is sufficiently low, no problem occurs even when using the structure as shown in FIG. 1 because of low intensity of the reflecting light. If the reflection factor is not sufficiently low, it is desirable to suppress the reflected ultraviolet light from reaching the white color LED package 2w. Accordingly, the modification having the ultraviolet light emission path 5P for releasing the reflecting light to the outside provides the better effect.

An explanation will be made with reference to a light beam Ray14 shown in FIG. 10D. The light beam Ray14 is reflected by the reflection surface 3r, and emitted from the dichroic prism 3 through the dichroic surface 3d. The emitted light beam Ray14 propagates in the ultraviolet light emission path 5p, and is emitted from the light shielding frame 5 to the outside without returning to the dichroic prism 3. The ultraviolet light emission path 5p is the space for emitting (releasing) emission light from the dichroic prism 3 to the outside of the light source 1.

Characteristics of the ultraviolet light emission path 5p of the modification will be described. Preferably, a width $W_{5p}$ of the ultraviolet light emission path 5p becomes substantially the same as or larger than that of the through hole 5a from where ultraviolet light is emitted when seen from the front as shown in FIG. 10C. This is because the light beam with its width substantially the same as that of at least the through hole 5a is expected to be emitted from the dichroic prism 3.

Preferably, the ultraviolet light emission path 5p has its length $L_{5p}$ that allows the path to reach an end surface of the light shielding frame 5 from the opening 5o for the purpose of emitting light from an end of the ultraviolet light emission path 5p to the outside of the light shielding frame 5 by removing the surface that returnably reflects light emitted from the dichroic prism 3. Ideally, the ultraviolet light emission path 5p is long sufficient to reach the end surface. However, a gap (ultraviolet light emission path 5p) adjacent to the dichroic prism 3, if any, reduces light reflected by the light shielding frame 5 to return to the dichroic prism 3.

The space (ultraviolet light emission path 5p) with its width substantially the same as or larger than that of the through hole 5a into which ultraviolet light is emitted is formed adjacent to the side surface of the dichroic prism 3 at the side of the dichroic surface 3d. As a result, the structure provides the effect of reducing quantity of ultraviolet light that reaches the LED package 2w, and suppressing UV deterioration of the resin 2wp. As a result, light beams emitted from the LEDs of multiple types are combined into the single light beam (beam), which can be made incident on the rear stage optical system of the biochemical analyzer. This provides the effect of attaining the light source using the long-life LED instead of the short-life tungsten lamp.

[Modification of LED Arrangement]

Figure 11:
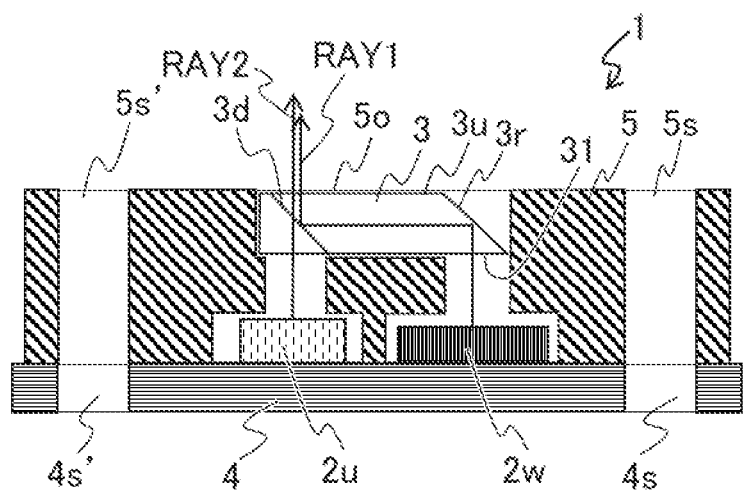
FIG. 11 is a drawing that shows a modification of LED disposal of a light source of the fourth embodiment.

In a modification as shown in FIG. 11, an arrangement of the LED package 2u for emitting ultraviolet light, and the LED package 2w for emitting light with wavelength longer than that of ultraviolet light as described in the embodiment is inverted. Detailed structures of the LED packages 2w and 2u have been described in the first embodiment. In the modification, the dichroic surface 3d is disposed opposite to the LED package 2u. The dichroic surface 3d performs the function of reflecting light from the LED 2wl, and allowing penetration of light from the LED 2ul. The reflection surface 3r is disposed opposite to the LED package 2w to perform the function of reflecting light to the side of the LED package 2u.

The structure as described above combines light beams into the single beam like the light beams Ray1 and Ray2 so that the beam is emitted from the light source 1. The light shielding frame 5 provides the effect of solving the problem that involves ultraviolet light emitted from the LED package 2u, and reducing quantity of ultraviolet light that reaches the resin 2wp contained in the LED package 2w. The LED arrangement as described in the first embodiment allows the light shielding frame 5 to provide the better effect because the reflection surface 3r reflects ultraviolet light to the side of the LED package 2w. The LED arrangement of the modification allows the light shielding frame 5 to provide substantially higher effect of suppressing generation of the stray light like the light beams Ray4 to Ray6 as described referring to FIG. 2.

Like the light beam Ray4 as shown in FIG. 2, inclinedly emitted light from the ultraviolet LED package 2u may be Fresnel reflected by the upper surface 3u of the dichroic prism 3, and refracted on the bottom surface 31 to make incident on the white color LED package 2w. Like the light beam Ray5, inclinedly emitted light from the ultraviolet LED package 2u may be Fresnel reflected by the bottom surface 31 to make incident on the white color LED package 2w. Like the light beam Ray6, light emitted from the side surface 2ucs of the sealing glass of the ultraviolet LED package 2u may make direct incident on the white color LED package 2w. It is therefore essential to allow the light shielding frame 5 to shield those light beams so as to reduce quantity of ultraviolet light that reaches the resin 2wp contained in the LED package 2w. Accordingly, the light shielding frame 5 provides the effect of reducing quantity of ultraviolet light to which the resin 2wp is exposed.

[Modification of Dichroic Prism]

In the first to fourth embodiments, the dichroic prism 3 has the reflection surface 3r and the dichroic surface 3d integrally formed. The structure, however, is not limited to the one as described above. In the present disclosure, members for performing the function of combining light beams are collectively referred to as the dichroic prism 3. Specifically, the member that performs functions of the reflection surface 3r and the dichroic surface 3d is referred to as the dichroic prism 3.

The reflection surface 3r performs the function of reflecting light from the LED opposite to the reflection surface 3r to the side of the dichroic surface 3d. The dichroic surface 3d may serve to reflect light incident from the reflection surface 3r, and to allow penetration of light from the LED opposite to the dichroic surface 3d.

Figure 12A:
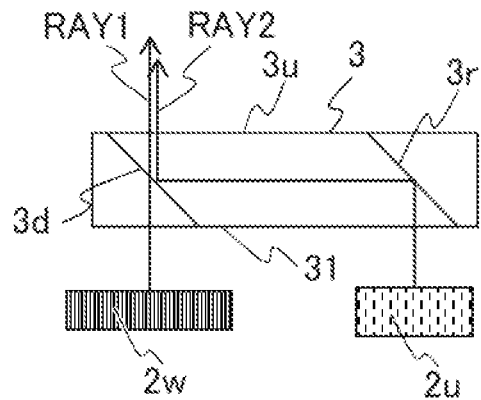
FIGS. 12A to 12C are drawings each showing a modification of the dichroic prism 3 of the fourth embodiment.
Figure 12B:
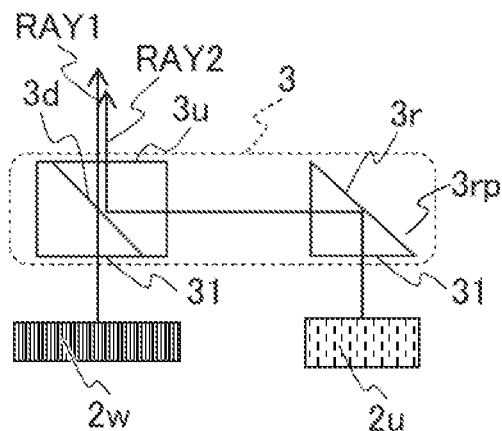
Figure 12C:
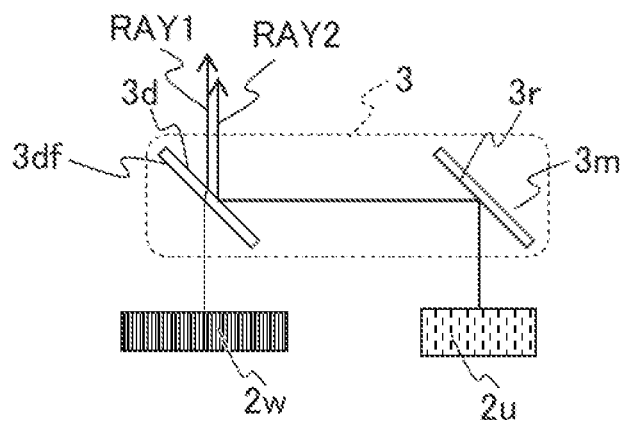

A modification of the dichroic prism 3 is shown in FIGS. 12A to 12C. FIG. 12A represents that the reflection surface 3r is a dielectric multi-layer film that is interposed between two glass members like the dichroic surface 3d. The dichroic prism 3 is formed into a rectangular parallelepiped shape having non-sharp ends of the reflection surface 3r unlike the dichroic prism 3 as shown in FIG. 1. Accordingly, the structure is advantageous to prevent cracking and chipping.

FIG. 12B represents that the reflection surface 3r and the dichroic surface 3d are disposed on the different members, respectively. The member including a right-angle prism 3rp and the member including the dichroic surface 3d are combined to form the dichroic prism 3 (member enclosed by a dotted line). Generally, the left-side member shown in FIG. 12B is only referred to as the dichroic prism 3. In the present disclosure, however, the structure including the reflection surface 3r and the dichroic surface 3d is referred to as the dichroic prism 3. The above-structured dichroic prism 3 is disposed in the light shielding frame 5. Adhesion of the dichroic prism 3 to the surface of the opposing light shielding frame 5 is the simplest fixing process.

FIG. 12C represents that the reflection surface 3r and the dichroic surface 3d are disposed on the different members, respectively. The reflection surface 3r is formed on the surface of a mirror member 3m. The mirror member 3m is formed by applying aluminum or the dielectric multi-layer film onto the surface of a flat plate such as glass. The thus formed reflection film becomes the reflection surface 3r. The dichroic surface 3d is formed on the surface of a dichroic filter 3df. The dichroic filter 3df is the member formed by applying the dielectric multi-layer film onto the surface of the flat plate such as glass. The thus formed dielectric multi-layer film becomes the dichroic surface 3d.

This structure is a combination of the members formed through the easiest process for forming the dichroic surface 3d and the reflection surface 3d.

The light source includes the parallel-disposed first LED and the second LED having the light emission spectrum different from that of the first LED, one of which emits ultraviolet light, and the dichroic prism 3 that includes the reflection surface and the dichroic surface. The reflection surface opposite to the first LED reflects light from the first LED. The dichroic surface opposite to the first LED reflects light from the first LED, and allows penetration of light from the second LED. When furnishing the above-structured dichroic prism 3, it is necessary to form the structure for fixing the generally employed filter such as the filter holder adjacent to the opening 5o of the light shielding frame 5.

In any of the structures, in order to effectively utilize light emitted from the ultraviolet LED package 2u by the rear stage optical system of the biochemical analyzer, it is necessary to adjust the optical system highly accurately. In order to make the adjustment easier, it is necessary to place the ultraviolet LED package 2u and the white color LED package 2w adjacently with each other. In the absence of the light shielding frame 5, ultraviolet light inclinedly emitted from the ultraviolet LED package 2u is reflected by the member that constitutes the light source 1 to reach the resin 2wp as the stray light. Accordingly, it is essential to shield light using the light shielding frame 5 for reducing quantity of ultraviolet light that reaches the resin 2wp contained in the LED package 2w. The light shielding frame 5 provides the effect of reducing quantity of ultraviolet light to which the resin 2wp is exposed. The light shielding frame 5 provides the effect of locating the reflection surface 3r and the dichroic surface 3d at given positions highly accurately as well as performing the light shielding function.

The respective structures shown in FIGS. 12B and 12C can be partially exchanged. For example, the mirror member 3m can be used instead of the right-angle prism 3rp as shown in FIG. 12B. The present invention is not limited to the structure of the dichroic prism 3.

[Usage of Light Source]

The light source of the present disclosure which has been described in detail is applicable to the light source for analyzer such as the spectrophotometer, and the one for plant raising in addition to the one for biochemical analyzer.

The present disclosure is not limited to the embodiments as described above, but includes various modifications. For example, the embodiments are described in detail for readily understanding of the present disclosure which is not necessarily limited to the one equipped with all structures as described above. It is possible to replace a part of the structure of one embodiment with the structure of another embodiment. The one embodiment may be provided with an additional structure of another embodiment. It is further possible to add, remove, and replace the other structure to, from and with a part of the structure of the respective embodiments.

REFERENCE SIGNS LIST

1 Light source
2 LED package
2u Ultraviolet LED package
2w White color LED package
2pk Package furnished with 2 LEDs with different light emission wavelength
3 Dichroic prism
4 LED substrate
5 Light shielding frame
6 Diffusion plate
7 Filter member
A1 First aperture stop
A2 Irradiation lens system
A3 Second aperture stop
A4 Sample cell
A5 Detection lens system
A6 Third aperture stop
A7 Light detector
A8 Imaginal plane

What is claimed is:

1. A light source, comprising:
a first LED and a second LED that are disposed in parallel, one of the first LED and the second LED emitting ultraviolet light, the second LED having a light emission spectrum different from that of the first LED;
a reflection surface that is opposite to the first LED, and reflects light of the first LED;
a dichroic surface that is opposite to the second LED, reflects light of the first LED, and allows light of the second LED to penetrate; and
a light shielding unit that is disposed on a side of the first LED or the second LED of the reflection surface and the dichroic surface and shields the ultraviolet light,
wherein the light shielding unit is opposite to a light emission surface of the first LED or the second LED.

2. The light source according to claim 1, further comprising:
a light shielding frame that fixes a member including the reflection surface and the dichroic surface,
wherein the light shielding frame includes a through hole that allows light from the first LED or the second LED to pass through and to reach the reflection surface and the dichroic surface.

3. The light source according to claim 2,
wherein width of the through hole is larger than width of the first LED when the through hole corresponds to the first LED or is larger than width of the second LED when the through hole corresponds to the second LED.

4. The light source according to claim 2,
wherein width of the reflection surface is larger than width of the through hole when the through hole corresponds to the reflection surface, and width of the dichroic surface is larger than width of the through hole when the through hole corresponds to the dichroic surface.

5. The light source according to claim 2,
wherein the first LED and the second LED are furnished on an LED substrate, and
wherein the light shielding frame includes a screw hole or a fixing through hole, the screw hole or the fixing through hole being for fixing the LED substrate and the light shielding frame to each other.

6. The light source according to claim 2,
wherein a hole size of the through hole is different according to a position in the depth direction of the through hole.

7. The light source according to claim 1, wherein
a diffusion plate that diffuses light is disposed so as to be opposite to the first LED or the second LED.

8. The light source according to claim 1,
wherein the first LED and the second LED are furnished in one package, and a wall surface is provided between the first LED and the second LED.

9. The light source according to claim 1,
wherein the first LED emits ultraviolet light.

10. The light source according to claim 9,
wherein the second LED emits light having longer wavelength compared to emission light of the first LED.

11. A biochemical analyzer, comprising a light source according to claim 1.

12. The biochemical analyzer according to claim 11, further comprising:
a sample cell; and
a lens that irradiates a light beam (beam) emitted from the dichroic surface to the sample cell.

13. A light source, comprising:
a first LED and a second LED that is disposed in parallel, one of the first LED and the second LED emitting ultraviolet light, the second LED having a light emission spectrum different from that of the first LED;
a dichroic prism that includes a reflection surface and a dichroic surface, the reflection surface being opposite to the first LED and reflecting light of the first LED to a side of the second LED, the dichroic surface being opposite to the second LED, reflecting light of the first LED, and allowing light of the second LED to penetrate; and
a light shielding unit that is disposed between a light emission surface of the first LED or the second LED and the dichroic prism.

14. The light source according to claim 13, further comprising:
a light shielding frame that fixes the dichroic prism,
wherein the light shielding frame includes a first through hole, a second through hole, and a fixing surface, the first through hole and the second through hole allowing light from the first LED and the second LED to pass through and to reach the reflection surface and the dichroic surface, the first through hole corresponding to the first LED, the second through hole corresponding to the second LED, the fixing surface being located between the first through hole and the second through hole and being opposite to the dichroic prism.

15. The light source according to claim 14,
wherein the fixing surface and the dichroic prism are adhered to each other.

16. A light source, comprising:
a first LED and a second LED that are disposed in parallel, one of the first LED and the second LED emitting ultraviolet light, the second LED having a light emission spectrum different from that of the first LED;
a reflection surface that is opposite to the first LED and reflects light of the first LED; and
a dichroic surface that is opposite to the second LED, reflects light of the first LED, and allows light of the second LED to penetrate,
wherein the other of the first LED and the second LED is a white color LED whose main emission light is not ultraviolet light, and
wherein a filter member is disposed so as to be opposite to a light emission surface of the white color LED, penetration efficiency with respect to ultraviolet light of the filter member being lower than penetration efficiency with respect to light having longer wavelength compared to the ultraviolet light.

17. The light source according to claim 16,
wherein the white color LED is covered by a coating member that does not allow ultraviolet light to pass through.

* * * * *